United States Patent [19]
Chi

[11] Patent Number: 6,084,262
[45] Date of Patent: Jul. 4, 2000

[54] ETOX CELL PROGRAMMED BY BAND-TO-BAND TUNNELING INDUCED SUBSTRATE HOT ELECTRON AND READ BY GATE INDUCED DRAIN LEAKAGE CURRENT

[75] Inventor: Min-hwa Chi, Hsinchu, Taiwan

[73] Assignee: Worldwide Semiconductor MFG, Hsinchu, Taiwan

[21] Appl. No.: 09/378,197

[22] Filed: Aug. 19, 1999

[51] Int. Cl.$^7$ .................................................. H01L 29/788
[52] U.S. Cl. .......................... 257/322; 257/321; 257/315; 257/316
[58] Field of Search ................................. 257/315, 316, 257/321, 322

[56] References Cited

U.S. PATENT DOCUMENTS 5,814,853   9/1998   Chen .

FOREIGN PATENT DOCUMENTS 53-138684   12/1978   Japan .
61-264764   11/1986   Japan .
62-35572     2/1987   Japan .

*Primary Examiner*—Stephen D. Meier
*Attorney, Agent, or Firm*—Blakely, Sokoloff, Taylor & Zafman

[57] ABSTRACT

An ETOX cell formed in a semiconductor substrate is disclosed. The ETOX cell includes a p-well formed within the substrate. A floating-gate is formed above the p-well, the floating-gate being separated from the substrate by a thin oxide layer. Next, a control gate is formed above the floating-gate, the floating-gate and the control gate being separated by a dielectric layer. A drain region is formed in the p-well and adjacent to a first edge of the floating-gate. The drain region is of a first dopant type. Finally, a source region is formed in the p-well and adjacent to a second edge of the floating-gate, the source region being of a second dopant type.

5 Claims, 3 Drawing Sheets

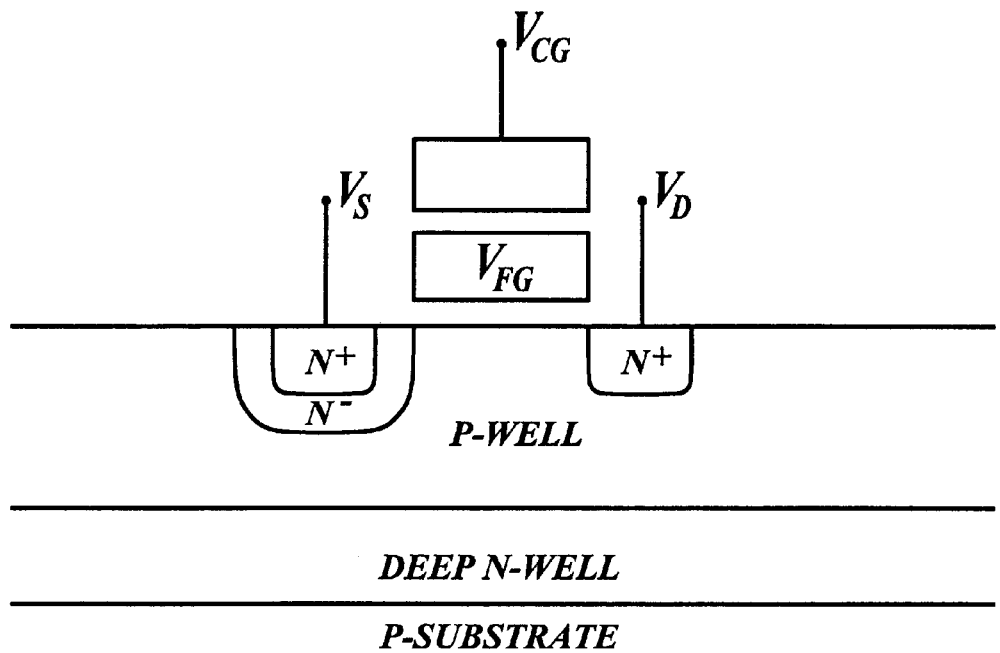
Fig. 1 *(PRIOR ART)*
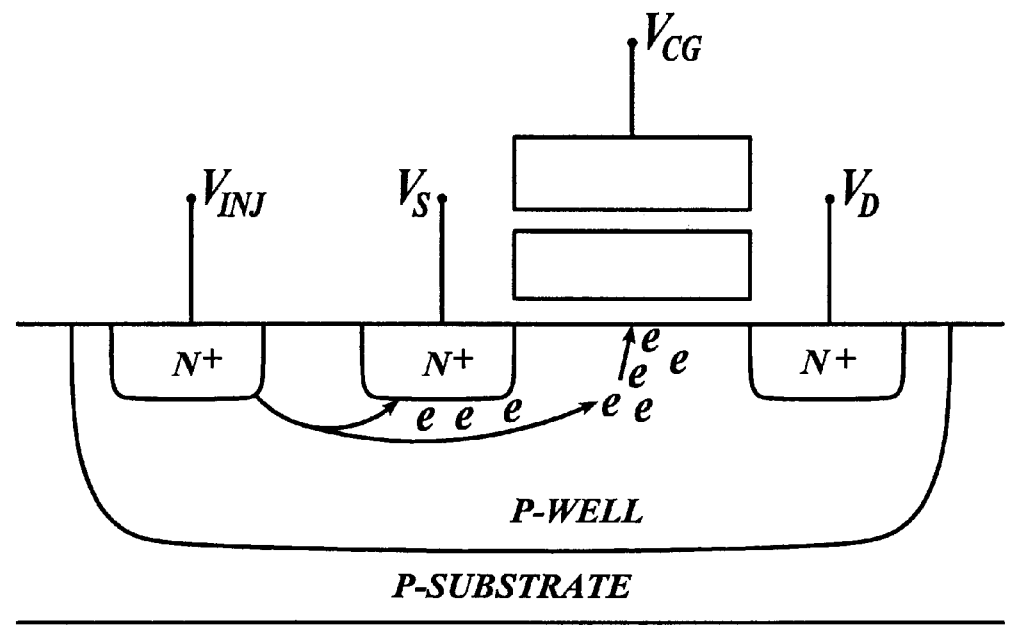
Fig. 2 *(PRIOR ART)*

ETOX CELL PROGRAMMED BY BAND-TO-BAND TUNNELING INDUCED SUBSTRATE HOT ELECTRON AND READ BY GATE INDUCED DRAIN LEAKAGE CURRENT

FIELD OF THE INVENTION

The present invention relates to ETOX flash memory, and more particularly, to an ETOX cell that includes a p-type source and an n-type drain region.

BACKGROUND OF THE INVENTION

The stack-gate ETOX cell, one of the most popular cell structures for flash memories, is widely programmed by channel hot-electron (CHE) and erased by Fowler-Nordheim (FN) tunneling through the source side or the channel area.

The n-channel ETOX cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the highest potential (Vcc) and the p-well is biased to the lowest potential (Vss). The n+ source is typically doubly implanted by $As^{75}$ (with a high dose of $3E15/cm^2 \sim 1E16/cm^2$ for the n+ junction) and $P^{31}$ (with a lower dose of $\sim 1E14/cm^2$ for the n-junction) so that the source junction can be biased at high voltage (e.g. $\sim 12v$) during erase operation. The n+drain is typically implanted by As only with a high dose ($\sim 1E16/cm^2$) and the drain side does not need the lightly-doped-drain (LDD) implant and spacer structure.

Note that the LDD structure is not useful in an ETOX cell, although it is important in normal CMOS transistors for reducing electrical field during switching for lower hot-electron generation. The tunnel oxide ($T_{ox}$) is typically 80–120 angstroms thick, the inter-poly dielectric ($T_{pp}$) typically consists of thin oxide-nitride-oxide (ONO) layers. As an example, a typical ETOX cell based on 0.35 um CMOS design rule has the following cell parameters: $T_{ox} \sim 90$ angstroms, $T_{pp} \sim 160$ angstroms (oxide equivalent thickness), and control-gate to floating-gate coupling ratio of $\sim 0.8$.

The ETOX cell of FIG. 1 is programmed by channel-hot-electrons (CHE). The bias for programming is typically: $V_d \sim 7v$, $V_{cg} \sim 9-12v$, and $V_s = 0v$. Under these bias conditions, there is a large channel current ($\sim 1$ mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is typically erased by Fowler-Nordheim (F-N) tunneling through the source side or the channel area. The bias during source side erase is typically: $V_d \sim 0v$ or floating, $V_{cg} \sim -5v$ to $0v$, and $V_s = +9$ to $+12v$. This establishes a large electrical field ($\sim 10Mv/cm$) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d \sim$ floating, $V_{cg} \sim 15v$, $V_{pw} \sim 0v$. A large electrical field ($-10 Mv/cm$) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high electrical field during erase.

The read biases of the prior art ETOX cell are typically: $V_d \sim 1v$ to $2v$, $V_{cg} \sim V_{cc}$, $V_s \sim 0v$, $V_{pw} \sim 0v$, $V_{dnw} = Vcc$, and $V_{sub} \sim 0v$. The channel may be inverted or not depending on the net electron charge stored on the floating-gate, and results in the on and off of the cell as measured by the read current $I_{read}$ representing the digital information of "1" or "0" stored in the cell.

The prior art ETOX cell of FIG. 1 can be programmed by another method known as substrate-hot-electron (SHE) as shown in FIG. 2. As seen in FIG. 2, an additional n+ junction is needed (i.e., the "injection" junction) for injecting electrons through the forward-biased n+ injection junction to p-well junction. Unfortunately, most of the injected electrons are not diffused towards the channel area, but instead toward the nearby n+source junction. Furthermore, the n+ source, p-well, and the n+ "injection" junction form a lateral npn bipolar transistor. The bipolar action of the npn bipolar transistor results in a large bipolar current at the node of n+ injection junction. Therefore, the SHE program scheme for the ETOX cell is not only very slow but also requires a large cell size due to the additional "injection" junction. As a result, this type of SHE programming scheme is not popular in commercial EPROMs or ETOX flash memories.

Another more recent SHE was reported in I. C. Chen, Kaya, and J. Paterson, "Band-to-band Tunneling Induced Substrate Hot-electron (BBISHE) Injection: A New Programming Mechanism for Nonvolatile Memory Devices," Tech. Digest Intl. Electron Devices Meetings, p. 263, 1989. The hot electrons are generated by the impact ionization of energetic electrons, which are released by the band-to-band tunneling electrons in a deep depleted p-type island in the middle of the channel area of the EPROM cell. The injection efficiency is very high (relative to conventional SHE) by generating hot electrons close to the channel area. However, the cell size is large due to the heavily doped additional p-type island.

What is needed is an ETOX cell and method for efficiently programming the ETOX cell without increasing the size of the cell.

SUMMARY OF THE INVENTION

An ETOX cell formed in a semiconductor substrate is disclosed. The ETOX cell comprises: a p-well formed within said substrate; a floating-gate formed above said p-well, said floating-gate separated from said substrate by a thin oxide layer; a control gate formed above said floating-gate, said floating-gate and said control gate separated by a dielectric layer; a drain implant formed in said p-well and adjacent to a first edge of said floating-gate, said drain implant of a first dopant type; and a source implant formed in said p-well and adjacent to a second edge of said floating-gate, said source implant of a second dopant type.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a schematic diagram of a prior art ETOX cell formed by a triple-well process;

FIG. 2 is a schematic diagram of a prior art ETOX cell using an injection junction;

DETAILED DESCRIPTION OF THE PREFERRED EMBODIMENT

Figure 3:
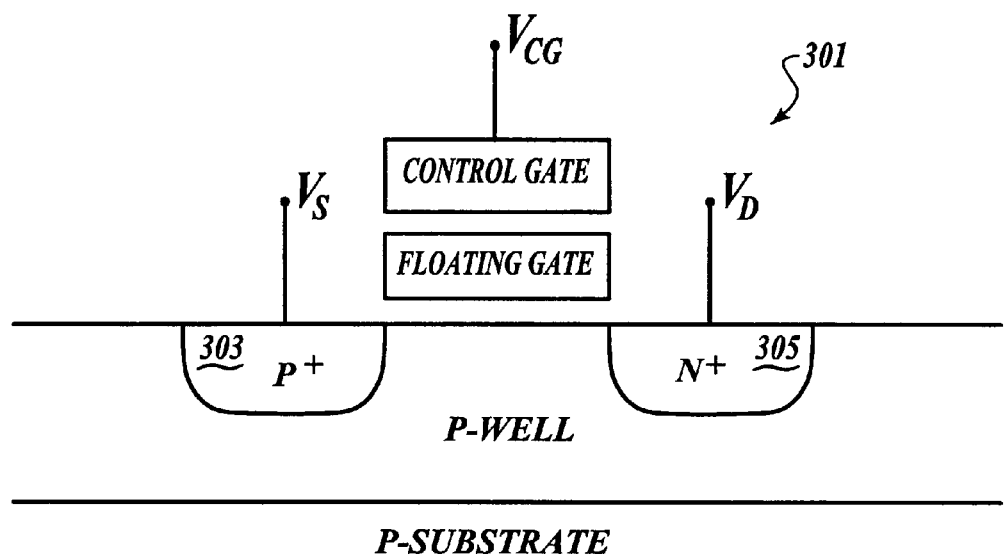
FIG. 3 is a schematic diagram of an ETOX cell formed in accordance with the present invention.

Turning to FIG. 3, an ETOX cell 301 formed in accordance with the present invention is shown. Note that the cell 301 is substantially similar to the n-channel ETOX cell shown in FIG. 1, except that the n+ source in the prior art ETOX cell has been replaced by a p+region 303 (referred to as "p+ source"). Other features are the same as in a conventional ETOX cell. For example, the tunnel oxide is approximately 80–100 angstroms thick, the interpoly dielectric between the control gate and the floating-gate is preferably oxide/nitride/oxide with about 100–180 angstroms (oxide equivalent) thickness. The control gate has a coupling ratio to the floating-gate of about 0.8.

As can be appreciated by those skilled in the art, the ETOX cell 301 is actually not a MOSFET transistor, since the source and drain 305 do not have the same dopant type. The p+ source 303 is simply a p+ contact to the substrate. The channel between the p+ source 303 and the n+ drain 305 can be inverted (by applying a high enough $V_{cg}$) and is electrically shorted to the n+ drain 305. However, there is no channel current flowing from the n+ drain 305 to the p+ source 303.

Figure 4:
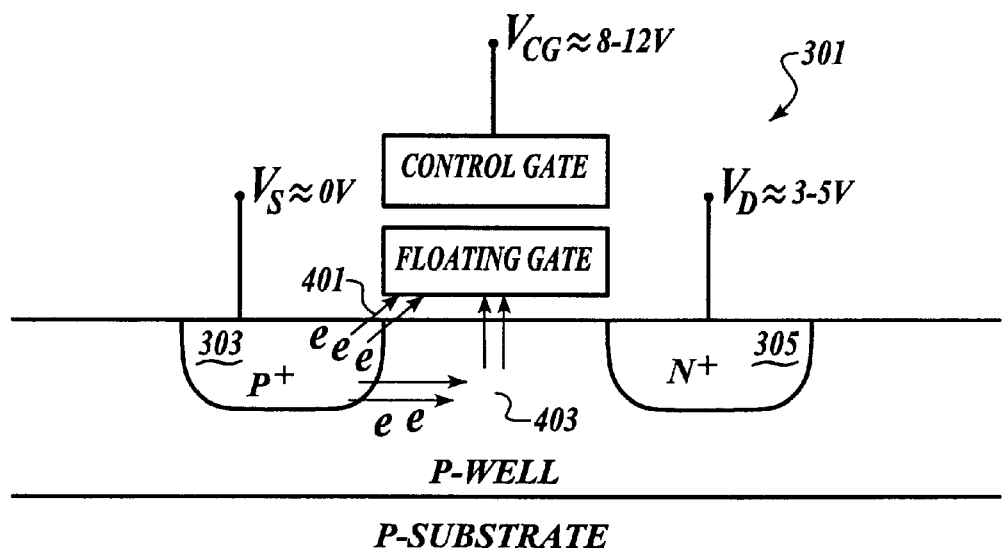
FIG. 4 is a schematic diagram of the ETOX cell of FIG. 3 during programming.

The operation of the ETOX cell 301 is described below. The ETOX cell 301 is programmed by band-to-band tunneling induced substrate hot electron (BBISHE) programming. Turning to FIG. 4, the n+ drain 305 is biased to about 3 to 5 volts. The p+ source 303 (i.e. the p-type substrate) is biased to 0 volts. The control gate potential ($V_{cg}$) is biased high enough to invert the channel between the n+ drain 305 and the p+ source 303. The inverted channel, which is shorted to the n+ drain 305, is therefore also biased to the drain bias (Vd). The control gate potential ($V_{cg}$) is also biased high enough (approximately 8 to 12 volts), so that electrons are generated at the surface of the p+ source 303 by band-to-band tunneling (BBT) mechanism.

There are two directions of flow for these electrons generated by BBT at the surface of the p+ source 303. First, some of them will flow directly toward the inverted channel, which is shorted to the n+drain 305 and biased to $V_d$. Those electrons are accelerated or "heated up" by the electrical field in the depletion region between the inverted channel and the p+ source 303. Those electrons that are hot enough will be injected toward the floating-gate. This programming mechanism is similar to the known "source side injection". These electrons are represented by reference numeral 401.

Secondly, some of the electrons will simply flow into the p-well and are then accelerated or "heated up" by the field in the depletion region near the drain junction and adjoining with the inverted layer. When these electrons become hot enough, they can be injected through the inversion layer and toward the floating-gate. These electrons are represented by the reference numeral 403. This mechanism is the same as the substrate hot electron (SHE) injection.

In summary the BBISHE programming on the ETOX cell 301 of the present invention is a combination of source side injection and SHE injection. Note that the programming process will continue (more negative charge onto the floating-gate) until the channel inversion layer disappears.

Figure 5:
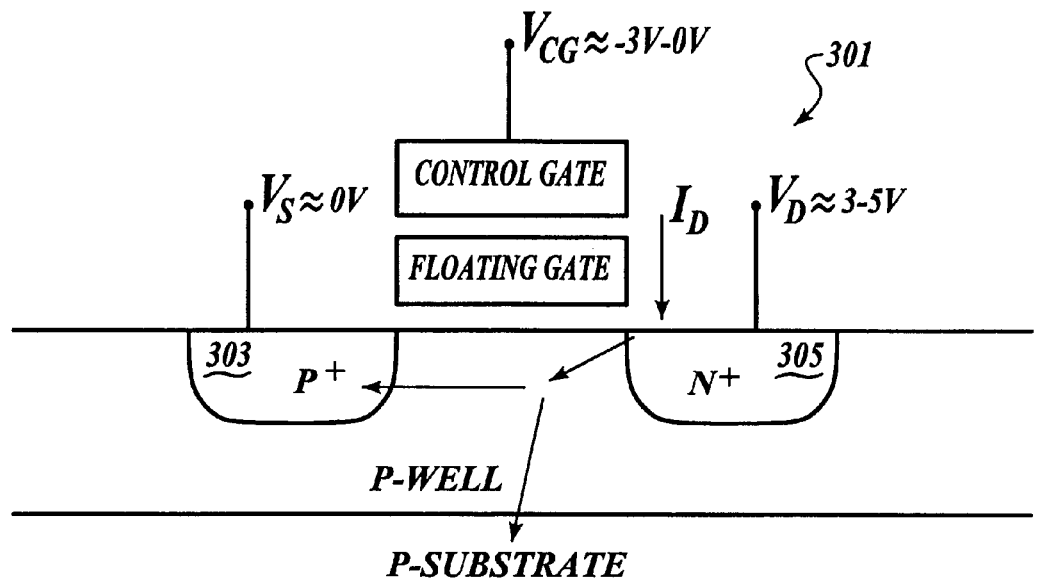
FIG. 5 is a schematic diagram of the ETOX cell of FIG. 3 during a read operation.

Next, turning to FIG. 5, the read operation of the ETOX cell 301 is next described. The read operation is based on the fact that the gate induced drain leakage (GIDL) current at the n+ drain 305 is strongly (exponentially) dependant on the electrical field between the drain 305 and the floating-gate. As a result, it is sensitive to the net charge on the floating-gate. The preferred bias for the read operation is as follows: $V_{cg}$ is 0 to –3 volts; $V_d$ is biased at 3 to 5 volts; and $V_s$ is 0 volts. The field between the drain and floating gate of a programmed cell (i.e. electron charge on the floating gate) is larger than that of a non-programmed cell (i.e. no charge on the floating gate), resulting in at least 3 orders of magnitude difference in the GIDL current measured at the n+ drain. The drain current $I_d$ is therefore strongly modulated by the floating-gate charge and represents the digital information "one" and "zero" stored in the ETOX cell 301. This type of read operation based on GIDL is novel to the present invention.

An analysis of the GIDL current during the read operation is shown below.

The floating-gate potential ($V_{fg}$) can be estimated by the law of charge conservation, i.e.

$$C_{pp}(V_{fg}-V_{cg})+(C_s+C_d)(V_{fg}-V_d)+C_{ch}(V_{fg}-V_d)=Q_f$$

Or $$V_{fg}=Q_f/C_t+V_{cg}\gamma_g V_d(\gamma_d+\gamma_s+\gamma_{ch})$$

Where $C_t=C_{pp}+C_s+C_d+C_{ch}$. The coupling ratios are defined as the following: $\gamma_g=C_{pp}/C_t$; $\gamma_d=C_d/C_t$; $\gamma_s=C_s/C_t$; $\gamma_{ch}=C_{ch}/C_t$; and $\gamma_g\gamma_d+\gamma_s+\gamma_{ch}=1$. $Q_f$ is the net charge on the floating-gate. When the cell is not programmed (i.e. "0"), there is no net charge on the floating-gate, i.e. $Q_f=0$. Thus, the floating-gate potential $V_{fg}$ for "0" during read is, $$V_{fg,0}=V_{cc}\gamma_d \text{ (cell in "0")}$$

When the cell is programmed (i.e. "1"), the maximum net charge on floating-gate at the end of programming can be estimated analytically by, $$Q_f/C_t \approx V_{to}-V_{cg(pg)}\gamma_g+V_{d(pg)}(\gamma_g+\eta)$$

where $V_{to}$ is the threshold voltage viewed from the floating-gate. $\eta$ is the coefficient of body-bias effect. Typically, $\eta \sim 0.15$. The $V_{cg(pg)}$ and $V_{d(pg)}$ are the biases during programming. The read bias is $V_{cg}=0_v$ and $V_d=V_{cc}$. Thus, from the above equations, the $V_{fg}$ for "1" during read operation is, $$V_{fg,1}=V_{to}-V_{cg(pg)}\gamma_g+V_{d(pg)}(\gamma_g+\eta)+V_{cc}\gamma_d \text{ (cell in "1")}$$

The surface electric field at the tunneling point in the overlap region between the drain and the floating-gate is $$E_{d,fg}=(V_d-V_{fg}-1.12)/(3T_{ox})$$

where $T_{ox}$ is the tunnel oxide thickness. The constant 1.12 represents the band gap of silicon material. The GIDL current (i.e. the $I_{read}$) is exponentially related to the magnitude of the field $E_{d,fg}$, which is related to the floating gate potential $V_{fg}$.

$$I_{read} = AE_{d,fg} exp(-B/E_{d,fg})$$

Where A and B are constants. B is approximately 21.3 Mv/cm from the published literature. Using typical bias values, the difference of $V_{fg}$ between "1" and "0" will be greater than 3 volts. This can result in at least 3 orders of magnitude difference in GIDL current at the n+ drain.

Figure 6:
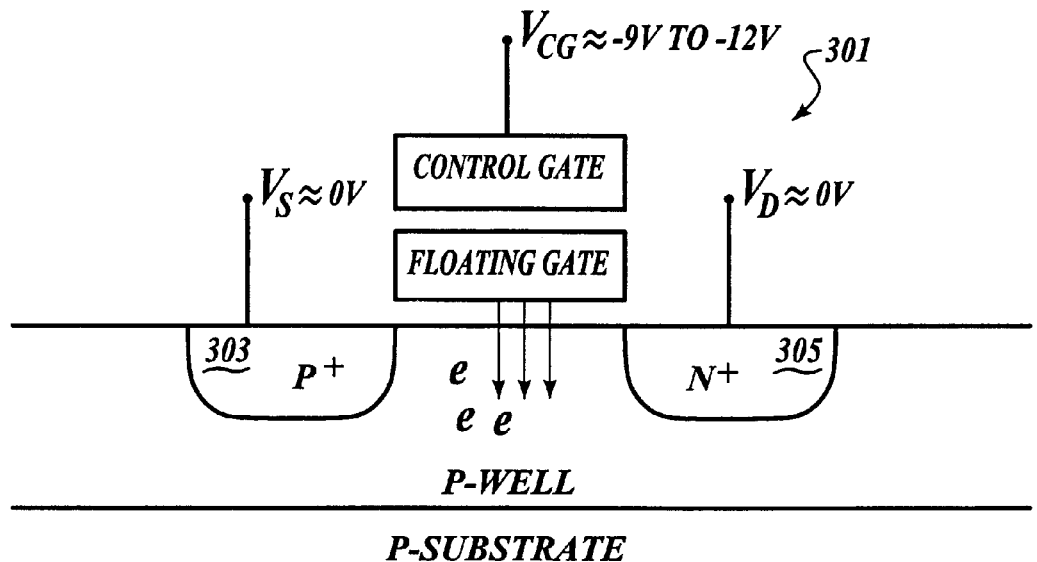
FIG. 6 is a schematic diagram of the ETOX cell of FIG. 3 during an erase operation.

Turning to FIG. 6, the erase action of the ETOX cell 301 can be seen. It is similar to conventional Fowler-Nordheim tunneling through the channel. There is a high enough field (>10 MV/cm) established between the n+ drain 305 and the floating-gate so that electrons on the floating-gate can tunnel by Fowler-Nordheim tunneling into the channel/drain/source area and be removed away. Preferably, the n+ drain 305 and the p+ source 303 are both grounded to zero volts and the control gate voltage $V_{cg}$ is approximately −9 to −12 volts.

Alternatively, the erase mechanism can be performed by Fowler-Nordheim tunneling through the n+ drain 305 by applying a drain voltage of 5 volts. Due to the large GIDL current occurring at the drain during erase, this type of erase is not preferred for the ETOX cell 301.

It should be noted that the new ETOX cell 301 is particularly suitable for cells fabricated on silicon on insulator (SOI) wafers. The floating body effect is completely eliminated, since the p+ source 303 is simply the body contact of the device. All operations are the same as cells fabricated on bulk wafers.

There are several advantages of the ETOX cell 301 of the present invention and its operation. First, the p+ source 303 is actually the contact to the p-substrate. Therefore, there is no need for a source interconnection as long as the p-well or p-substrate is grounded. A smaller cell size is thus more easily achieved. Second, the n+ drain 305 does not carry a large current during all operations. Therefore, a buried n+ line is suitable for cell operations. This will further reduce the cell size. Third, the BBISHE programming and Fowler-Nordheim erase through the channel are all low current and low power operations. Finally, the GIDL read operation is insensitive to temperature due to the nature of the GIDL mechanism.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An ETOX cell formed in a semiconductor substrate, said ETOX cell comprising:

a p-well formed within said substrate;

a floating-gate formed above said p-well, said floating-gate separated from said substrate by a thin oxide layer;

a control gate formed above said floating-gate, said floating-gate and said control gate separated by a dielectric layer;

a drain region formed in said p-well and adjacent to a first edge of said floating-gate, said drain region of a first dopant type; and a source region formed in said p-well and adjacent to a second edge of said floating-gate, said source region of a second dopant type.

2. The cell of claim 1 wherein said first dopant type is n-type and said second dopant type is p-type.

3. The cell of claim 1 wherein the cell is programmed by:

biasing said control gate to a voltage sufficient to invert the channel between said source region and said drain region;

biasing said source regionmplant to about 0 volts; and biasing said drain region to about 3–5 volts.

4. The cell of claim 3 wherein the cell is erased by;

biasing said control gate to about −9 to −12 volts; and biasing said source region and said drain region to about 0 volts.

5. The cell of claim 3 wherein the cell is read by:

biasing said control gate to about 0 to −3 volts;

biasing said drain region to about 3 to 5 volts; and biasing said source region to about 0 volts.

\* \* \* \* \*